(12) United States Patent
Sugimoto

(10) Patent No.: US 8,142,601 B2
(45) Date of Patent: Mar. 27, 2012

(54) METHOD FOR MANUFACTURING LOW RESISTANCE SUBSTRATE

(75) Inventor: Akira Sugimoto, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 570 days.

(21) Appl. No.: 12/295,605

(22) PCT Filed: Mar. 29, 2007

(86) PCT No.: PCT/JP2007/056905
§ 371 (c)(1),
(2), (4) Date: Jan. 26, 2009

(87) PCT Pub. No.: WO2007/116806
PCT Pub. Date: Oct. 18, 2007

(65) Prior Publication Data
US 2009/0173440 A1    Jul. 9, 2009

(30) Foreign Application Priority Data
Mar. 31, 2006   (JP) ................ P2006-100611

(51) Int. Cl.
*B29C 65/00* (2006.01)
*B32B 37/00* (2006.01)

(52) U.S. Cl. ............ 156/297; 156/308.2; 156/280

(58) Field of Classification Search .......... 156/176, 156/181, 297, 178, 280, 308.2, 309.6; 257/457, 257/459; 438/98; 136/256
See application file for complete search history.

(56) References Cited

U.S. PATENT DOCUMENTS

| | | | |
|---|---|---|---|
| 3,754,117 A * | 8/1973 | Walter | 219/383 |
| 5,365,657 A * | 11/1994 | Brown et al. | 29/850 |
| 6,008,451 A * | 12/1999 | Ichinose et al. | 136/256 |
| 2005/0241692 A1* | 11/2005 | Rubin et al. | 136/256 |
| 2005/0270464 A1* | 12/2005 | Seo et al. | 349/139 |

FOREIGN PATENT DOCUMENTS

| | | |
|---|---|---|
| JP | 2000-259096 A | 9/2000 |
| JP | 2001-144312 A | 5/2001 |
| JP | 2002-277855 A | 9/2002 |
| JP | 2003-297584 A | 10/2003 |
| JP | 2004103830 A * | 4/2004 |
| JP | 2004-288607 A | 10/2004 |
| JP | 2005-056846 A | 3/2005 |
| JP | 2005-116330 A | 4/2005 |
| JP | 2005-136050 A | 5/2005 |
| JP | 2006-019251 A | 1/2006 |
| WO | 2005/041217 A1 | 5/2005 |

OTHER PUBLICATIONS

Machine translation of JP 2004013830 date unknown.*
Japanese Patent Office Action dated Oct. 5, 2010.

* cited by examiner

*Primary Examiner* — John Goff
(74) *Attorney, Agent, or Firm* — Sughrue Mion, PLLC

(57) ABSTRACT

A low resistance substrate is manufactured by a mounting step in which a linear article made of a resin-covered metal is mounted on a substrate; a fixing step in which the resin by which the metal is covered is melted by heating the linear article, and the metal is fixed on the substrate; and a film forming step in which an electrode is formed filmily so as to cover the substrate and the metal fixed on the substrate with the electrode.

7 Claims, 5 Drawing Sheets

(A)

(B)

(C)

(D)

(A)

(B)

(C)

(D)

(A)

(B)

(C)

(D)

METHOD FOR MANUFACTURING LOW RESISTANCE SUBSTRATE

CROSS REFERENCE TO RELATED APPLICATION

This application is a National Stage of International Application No. PCT/JP2007/056905 filed Mar. 29, 2007, claiming priority based on Japanese Patent Application No. 2006-100611, filed Mar. 31, 2006, the contents of all of which are incorporated herein by reference in their entirety.

TECHNICAL FIELD

The present invention relates to a method for manufacturing the low resistance substrate.

BACKGROUND ART

Display devices such as organic EL panels have been used for various electronic equipments such as displays of cellular phones, car audio systems, or the like. In recent years, further enlargement of the organic EL panel has been sought.

This organic EL panel may have a constitution where an organic layer is sandwiched between two electrodes which are formed on a substrate so as to face each other. By impressing the electric field between the electrodes, the organic layer emits light.

In order to lead out the luminescence of the organic layer externally, at least one of the electrodes should be designed as a transparent or semitransparent electrode. However, since the transparent or semitransparent electrode possessed a relatively large electrical resistance in general, the organic EL panel is used to cause unevenness of brightness in the luminescence due to a certain voltage drop.

In order to solve this problem, an electrically conductive material, that acts as an auxiliary electrode to lower resistance, has been formed in accordance with the vapor deposition method or other known methods. (This electrically conductive material is called "bus line".).

It becomes easy to flow to the electrode in the current by forming the bus line that consists of the electrically conductive material, and the degression of voltage can be prevented.

Patterning of the bus line has been done by using the photolithograph method etc., to make the bus line to narrow width comparatively because the bus line should not disturb the luminescence of organic EL panel.

Since a certain influence against the organic layer in the photolithograph process is considered, in general, an electrode and the bus line are formed on the substrate in advance of forming the organic layer on the substrate.

Recently, in order to prevent the voltage drop, improvements in material of the bus line and in the width and thickness of the bus line has been further developed so as to lower the resistance of the bus line (Patent literatures 1 and 2).
[Patent literature 1]
Japanese Patent Laid-Open 2002-277855
[Patent literature 2]
Japanese Patent Laid-Open 2003-297584

DISCLOSURE OF THE INVENTION

Problems to be Solved by the Invention

There is a necessity for lowering resistance further following the enlargement of screen size in recent years, and thus the bus line is inevitably requested to enlarge the film thickness and/or the line width thereof in order to make the bus line into a lower resistance one.

When the bus line is designed to have a larger width, however, aperture ratio on leading out the luminescence from the substrate side becomes lower. When the bus line is designed to have a larger thickness, the time and rate for forming the film of the bus line by vapor depositing the film on the substrate become larger, and thus a fear that the substrate sustains damages and a fear that the cost for material becomes higher, which is owing to the increment in the quantity of the material, may arise.

In view of the above described problems, a main object of the present invention is to provide a method for manufacturing a low resistance substrate which is useful, for instance, as a low resistance substrate for display devices, etc.

Means for Solving the Problems

The invention claimed in claim 1 which solves the above-mentioned problems is characterized by comprising amounting step in which a linear article made of a resin-covered metal is mounted on a substrate; a fixing step in which the resin by which the metal is covered is melted by heating the linear article, and the metal is fixed on the substrate; and a film forming step in which an electrode is formed filmily so as to cover the substrate and the metal fixed on the substrate with the electrode.

Further, the invention claimed in claim 5 which solves the above-mentioned problem is characterized by comprising a resin layer forming step in which a resin layer is formed on a substrate; a mounting step in which a metal is mounted on the resin layer; a fixing step in which the resin layer is melted by heating the metal, and the metal is fixed on the substrate; and a film forming step in which an electrode is formed filmily so as to cover the substrate and the metal fixed on the substrate with the electrode.

EXPLANATION OF NUMERALS

Figure 1:
FIG. 1 is a diagram illustrating a first embodiment of the method for manufacturing low resistance substrate for display device.
Figure 1:
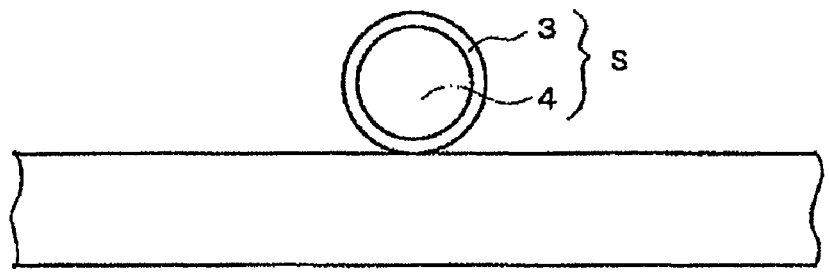
Figure 1:
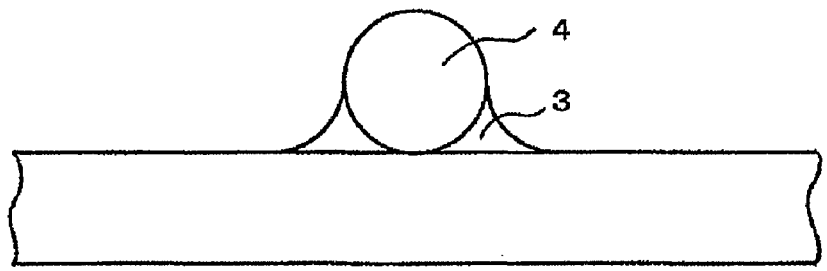
Figure 1:
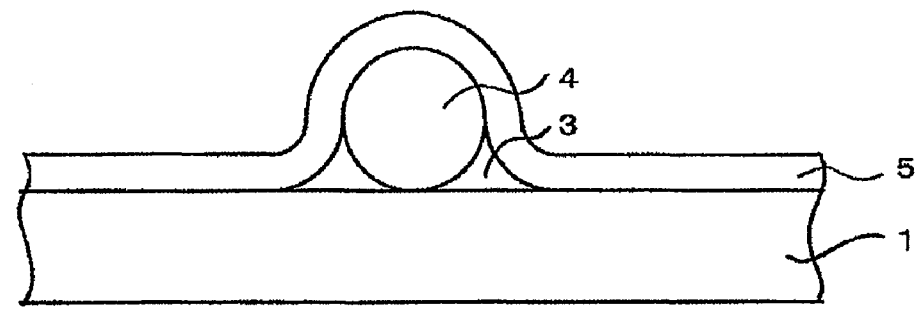

1 - - - Substrate
2 - - - Resin layer
3 - - - Resin
4 - - - Metal
5 - - - Transparent electrode
S - - - Linear article

BEST MODE FOR CARRYING OUT THE INVENTION

(I) First Embodiment

Now, the first embodiment of the method for manufacturing low resistance substrate according to the present invention will be described in detail with reference to FIG. 1.

Incidentally, the following description will be made on the assumption that the present invention is applied for manufacturing of a low resistance substrate which is useful for a display device.

Further, in order to simplify the explanation, the following description will be made on the assumption that a metal wire is used as an example of the metal.

FIG. 1(A) is a view illustrating a substrate 1 under the condition that a linear article S has not been mounted on the substrate 1 yet.

In the method according to the present invention, the substrate 1 to be used is not particularly limited, and can select an arbitrary insulator in accordance with the situation in which a low resistance substrate R for the display device which is the object to be manufactured and the performance to be required for the low resistance substrate R.

When the transparency is required, for instance, a plastic substrate and the glass substrate may be used.

Although the thickness of the substrate 1 may be varied by the usage of the substrate, in general, it may be in the range of about 25 μm-5 mm, and especially it is preferable to be in the range of 100 μm-1 mm.

Although it is not shown in the figure, it is possible to form an adhesiveness improving layer made of an organic or inorganic material onto the substrate 1 (adhesiveness improvement layer forming step), and it is also possible to subject the substrate 1 to a surface reforming process for improving the adhesion (surface reforming step).

As the method for forming the adhesiveness improving layer onto the substrate 1, any known forming procedure such as coating methods and printing method may be adaptable.

As the coating methods, for instance, various wet coating methods such as roll coating, flow coating, spray coating, spin coating, etc.; and various vapor phase growing methods such as vapor deposition method, sputtering method, CVD (Chemical Vapor Deposition) method, etc., are enumerated.

Further, as the adhesiveness improving layer used in this step, for instance, various organic compounds such as organic silane compounds, urethane resins, epoxy resins, etc.; and various inorganic compounds such as silicon oxide, silicon nitride, aluminum oxide, titanium oxide, etc., are enumerated, and an appropriate one may be selected from them in accordance with the usage of the substrate and so on.

As the surface reforming process, for instance, plasma treatment, corona discharging treatment, UV-ozone treatment, laser annealing treatment, etc., are enumerated, and an appropriate one may be selected from them in accordance with the usage of the substrate and so on.

When the adhesiveness improving layer is formed on the substrate 1 and/or the substrate 1 is treated with the surface reforming process, it becomes possible to improve the adhesiveness between the substrate 1 and the resin 3 on melting the resin 3 which is included in the linear article S so as to mount the linear article S onto the substrate, and as a result, it is possible to fix the metal wire 4 firmly.

In addition, strength of the substrate, per se, can be also improved by the effect of such an adhesion improvement.

FIG. 1 (B) is a view illustrating the state that the linear article S is mounted on the substrate 1 at the mounting step.

In the method according to the present invention, the method for mounting the linear article S onto the substrate 1 and the location at which the linear article S is placed are not particularly limited, and thus, the linear article S can be placed at an arbitrary position where a so-called "bus line" is intended to form by an appropriate method in accordance with the electric conductivity of a transparent electrode which will be formed later on and the size of the substrate 1.

Here, the linear article S has a constitution that the metal wire 4 is covered with resin 3.

Although the metal wire 4 to be used is not particularly limited, it is desirable to be made of, for instance, copper, silver, gold, iron, aluminum, molybdenum, chromium, nickel, etc. Because, the metal wire 4 is used as an auxiliary electrode, i.e., so-called "bus line", for manufacturing the low resistance substrate to be used for display devices.

Further, with respect to the sectional configuration of the metal wire 4, since the electrode 5 will be formed filmily so as to cover the substrate 1 and the metal wire 4 fixed on the substrate 4 with the electrode as mentioned later, it is preferable that the face of the metal wire 4 which should be contact with the electrode 5 is smooth one, and therefore, it is desirable that the sectional configuration of the metal wire 4 is circle, oval, or the like.

When the sectional configuration of the metal wire 4 is circle, the diameter of the metal wire 4 is not particularly limited.

In the case that the luminescence is led out from the substrate 1 side, however, the diameter should be a size in the level where the aperture ratio is not decreased, and the metal wire does not become an obstacle on the visual displaying.

Further, it is desirable that the diameter of the metal wire is a size that the electrode which will be formed on the metal wire 4 concerned may be not disconnected, concretely, the diameter is desirable to be in the range of 1 μm-1 mm, and more particularly, to be in the range of 10 μm-200 μm.

As mentioned above, when the metal wire 4 is mounted on the substrate 1, not only the effect that the metal wire 4 functions as an auxiliary electrode to the electrode, but also an effect that the rigidity of the entire substrate is enhanced can be expected.

The resin 3 which composes the linear article S plays a role of fixing the metal wire onto the substrate 1 when the resin undergoes melting (This step will be described in detail later.). In order to play this role, it is desirable that the resin 3 is a thermoplastic resin.

Concretely, for instance, polyethylenes, polypropylenes, polystyrenes, vinyl chloride resins, acrylic resins, polyethylene terephthalates, polycarbonates, polyolefins, etc., can be enumerated.

Further, as an auxiliary means for fixing, it is possible to utilize the curing of resin by means of light or heat.

In this case, a thermosetting resin or an photo-curing resin can be used as the resin 3.

Epoxy resins, polyimide resins, phenolic resins, etc. can be enumerated as these curing resins.

Although the amount of the resin 3 by which the metal wire 4 is coated (the thickness of the coated resin) is not particularly limited, it is desirable that the amount is enough to be capable to play the above-mentioned role, and concretely, it is desirable that the thickness of the coated resin is about 10-50% of the diameter of the metallic wire used.

FIG. 1 (C) is a view illustrating the state that the metal wire 4 is fixed on the substrate 1 by heating the linear article S and thereby melting the resin 3 which has coated the metal wire 4 at the mounting step.

As the heating method for the linear article, the resistance heating by the passage of electric current through the metal, the heating by applying hot air to the linear article or irradiating the linear article with heat, and the heating by contacting a heated wire to the substrate or the metal are enumerated. However, the heating method is not limited thereto.

By heating the linear article S, it is possible to melt the resin which have coated the metal wire 4, which is followed by allowing the melted resin to conform to the ambient space of the metal wire 4 and thus allowing the resin 3 to play the role of fixing the metal wire 4 on the substrate 1.

Further, since the resin 3 can come into the space between the substrate 1 and the metal wire 4 as mentioned above and thus an smooth curve is formed at the space between the metal wire 4 and the substrate 1 as the outline of the space, it becomes hardly possible to cause a disconnection in the electrode 5 which is formed filmily on the substrate 1.

Moreover, since the metal wire 4 is fixed onto the substrate by melting the resin 3, there is no need to form an electrically conductive material layer for the so-called "bus line" by the vapor deposition method or the like, and thus, it becomes possible to avoid causing a warp in the substrate 1 and so on due to the heat on the vapor deposition process.

FIG. 1 (D) is a view illustrating the state that the electrode 5 is formed filmily so as to cover the substrate 1 and the metal wire 4 fixed on the substrate 1 with the electrode 5.

The electrode 5 should show transparency or semitransparency since the luminescence of the organic layer is let out through the electrode 5.

As the method for forming the electrode 5 filmily, for instance, vapor deposition method, sputtering method, CVD (Chemical Vapor Deposition) method, sol-gel method, etc., are enumerated. However, it is not particularly limited thereto, and the electrode 5 may be formed filmily by any one of the conventionally used methods.

Further, as the material of the electrode 5 used in this step, there is no particular limitation. Concretely, for instance, transparent electrodes such as ITO (Indium Tin Oxide), IZO (Indium Zinc Oxide), etc.; and metal electrodes such as aluminum, chromium, silver, and alloys thereof, etc., may be preferably used.

Incidentally, in the method according to the present invention, it is possible to provide a cooling step for cooling the metal wire 4 after the fixing step shown in FIG. 1 (C) and before the film forming step shown in FIG. 1 (D).

Although this cooling step is not essential for the method according to the present invention, when cooling the metal wire 4 after the fixing the metal wire 4 onto the substrate 1 and before the film formation of the electrode 5, it is possible to harden quickly the resin 3 which has conformed to the ambient space of the metal wire 4, and thus it is possible to fix the metal wire 4 onto the substrate 1 firmly.

As the method for cooling the metal wire 4, for instance, cooling by applying a cold air, cooling by contacting the substrate or the metal with a refrigerant, etc., can be enumerated.

(II) Second Embodiment

Now, another embodiment of the method according to the present invention will be described.

Incidentally, since the basic constitution of this embodiment is similar to the one explained in detail in the above-mentioned first embodiment, in the following, the explanation will be done so as to be focused on parts which differentiate this embodiment from the first embodiment.

Figure 2:
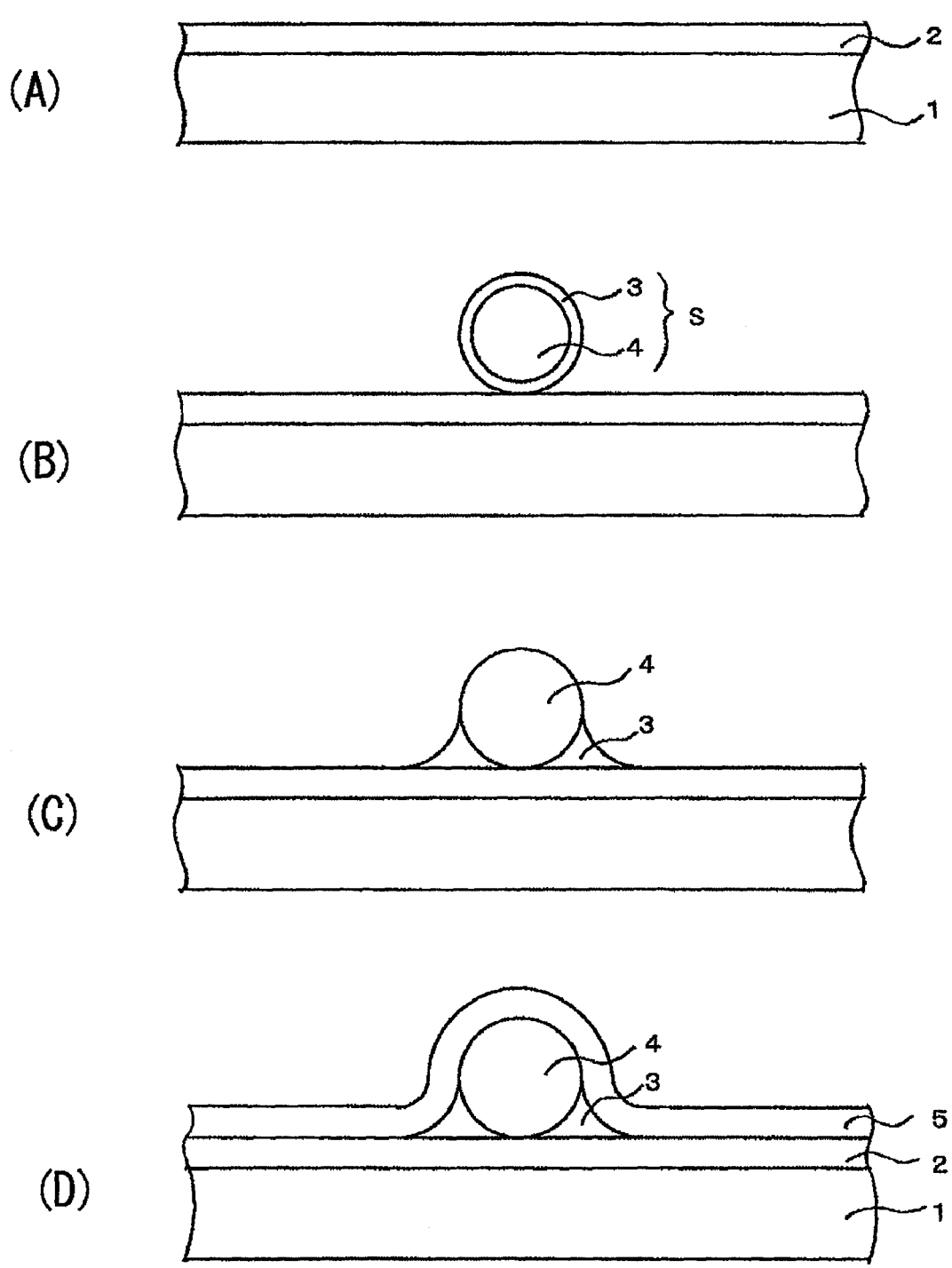
FIG. 2 is a diagram illustrating a second embodiment of the method for manufacturing low resistance substrate for display device.

FIG. 2 (A) is a view illustrating the state that a resin layer 2 is formed on a substrate 1 at a resin layer forming step which is provided as the step preliminary to the mounting step described in the first embodiment.

As the method of forming the resin layer 2 onto the substrate 1, any known forming procedure such as coating methods and printing method may be adaptable.

As the coating methods, for instance, various wet coating methods such as roll coating, flow coating, spray coating (spin coating), etc., are enumerated.

Although the thickness of the resin layer 2 is not particularly limited, it is desirable that the thickness of the resin layer is about 5-90% of the diameter of the metallic wire used.

Further, as the resin layer 2 to be used in this step, for instance, any resin such as polyethylenes, polypropylenes, polystyrenes, vinyl chloride resins, acrylic resins, polyethylene terephthalates, polycarbonates, polyolefins, etc., may be used in accordance with the usage of the substrate and so on.

When the resin layer 2 is formed onto the substrate 1, it becomes possible to smooth the surface of the substrate 1, wherein the smoothed condition is convenient for mounting the linear article S onto them.

Moreover, when the resin 3 which composes the linear article S and the resin which composes the resin layer 2 are set to be the same, it becomes possible to enhance the adhesiveness between the resin 3 and the resin layer 2 on melting the resin 3 which composes the linear article S, and thus it is possible to fix the metal wire 4 firmly.

In addition, the strength of the substrate, per se, can be also improved by providing such a resin layer 2.

Incidentally, as the substrate 1 onto which the resin layer 2 is formed, the substrates as described in the first embodiment may be used.

Although the following steps are shown in FIGS. 2 (B)-2 (D), the explanations about these steps are omitted herein because these steps are similar to the corresponding steps described in the first embodiment.

(II) Third Embodiment

Now, a further other embodiment of the method according to the present invention will be described.

Incidentally, since the basic constitution of this embodiment is similar to the one explained in detail in the above-mentioned first embodiment, in the following, the explanation will be done so as to be focused on parts which differentiate this embodiment from the first embodiment.

FIG. 3(A) is a view illustrating the state that a resin layer 2 is formed on a substrate 1 at a resin layer forming step, and is similar to what explained in the above-mentioned second embodiment.

Figure 3:
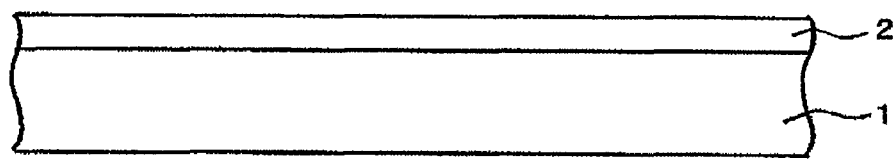
FIG. 3 is a diagram illustrating a third embodiment of the method for manufacturing low resistance substrate for display device.
Figure 3:
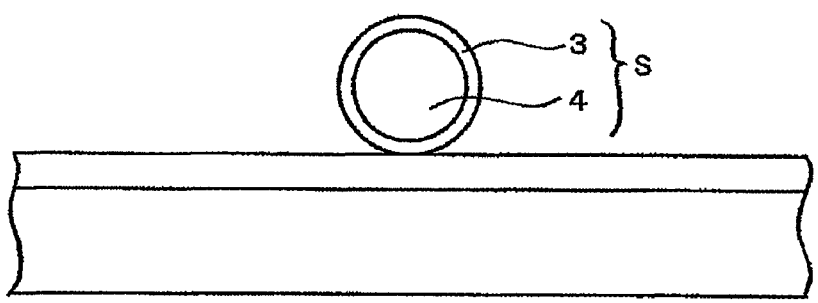
Figure 3:
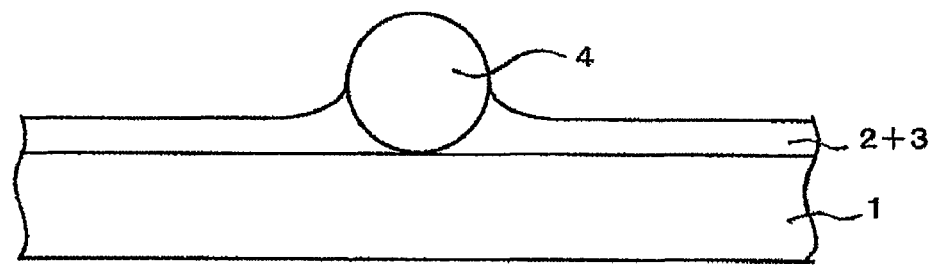
Figure 3:
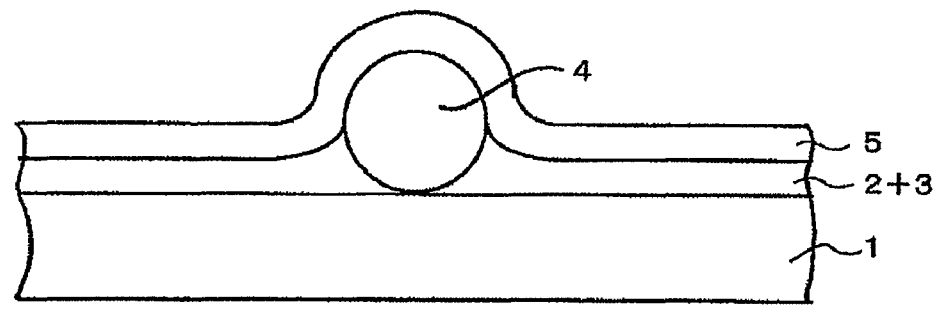

FIG. 3 (B) is a view illustrating the state that a linear article S is mounted on the substrate 1, and is similar to what explained in the above-mentioned second embodiment.

FIG. 3 (C) is a view illustrating the state that the metal wire 4 is fixed on the substrate 1 by heating the linear article S and thereby melting both the resin 3 which has coated the metal wire 4 and the resin layer 2 which has been formed on the substrate 1 at a fixing step.

According to this embodiment, it is possible to melt both the resin 3 and the resin layer 2 which have been formed on the substrate 1 by heating the linear article S.

Then, the metal wire 4 which composes the linear article S is allowed to be embedded in the resin 3 and the resin layer 2 as a result of the progress that the metal wire 4 thrusts the melted resin 3 and melted resin layer 2 around the wire. Thus, the circumference of the metal wire can be covered smoothly by the resin 3 thrust aside and the melted resin layer 2, and which fact can contribute to the fixing of the metal wire 4 onto the substrate 1 definitively.

In this embodiment where the metal wire 4 is fixed by such a method as mentioned above, it is preferable that the material of the resin layer 2 formed on the substrate is a thermoplastic resin capable of melting by heat.

For instance, as the thermoplastic resin, polyethylenes, polypropylenes, polystyrenes, vinyl chloride resins, acrylic resins, polyethylene terephthalates, polycarbonates, polyolefins, etc., may be used under an appropriate selection.

FIG. 3 (D) is a view illustrating the state that the electrode 5 is formed filmily so as to cover the substrate 1 and the metal wire 4 fixed on the substrate 1 with the electrode 5, and is similar to what explained in the above-mentioned first and second embodiments.

Incidentally, in this embodiment, it is possible to provide a cooling step for cooling the metal wire 4 after the fixing step shown in FIG. 3(C) and before the film forming step shown in FIG. 3(D) in an analogue fashion with the first embodiment mentioned above.

Although this cooling step is not essential for the method according to the present invention, when cooling the metal wire 4 after the fixing the metal wire 4 onto the substrate 1 and before the film formation of the electrode 5, it is possible to harden quickly the resin 3 and the resin layer 2 which have conformed to the ambient space of the metal wire 4, and thus it is possible to fix the metal wire 4 onto the substrate 1 firmly.

(IV) Fourth Embodiment

Now, a still other embodiment of the method according to the present invention will be described.

Incidentally, since the basic constitution of this embodiment is similar to the one explained in detail in the above-mentioned first embodiment, in the following, the explanation will be done so as to be focused on parts which differentiate this embodiment from the first embodiment.

FIG. 4(A) is a view illustrating the state that a resin layer 2 is formed on a substrate 1 at a resin layer forming step, and is similar to what explained in the above-mentioned second embodiment.

Figure 4:
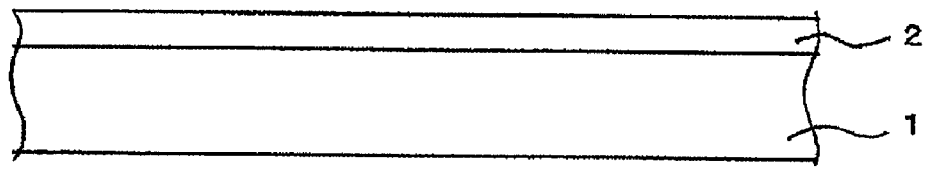
FIG. 4 is a diagram illustrating a fourth embodiment of the method for manufacturing low resistance substrate for display device.
Figure 4:
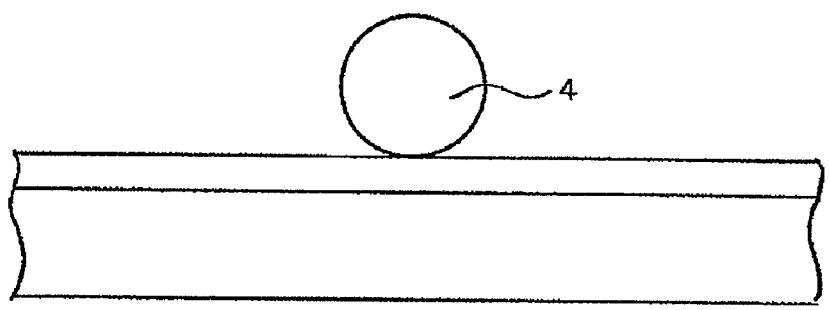
Figure 4:
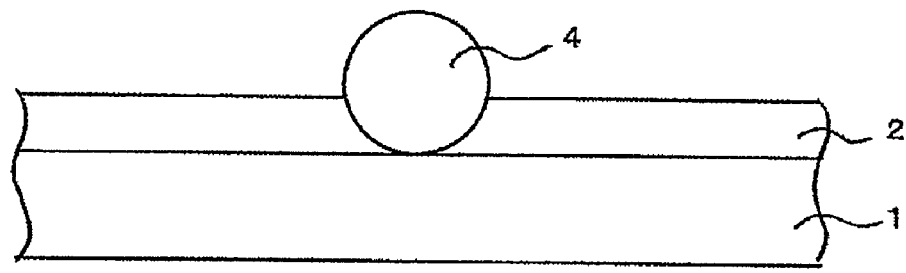
Figure 4:
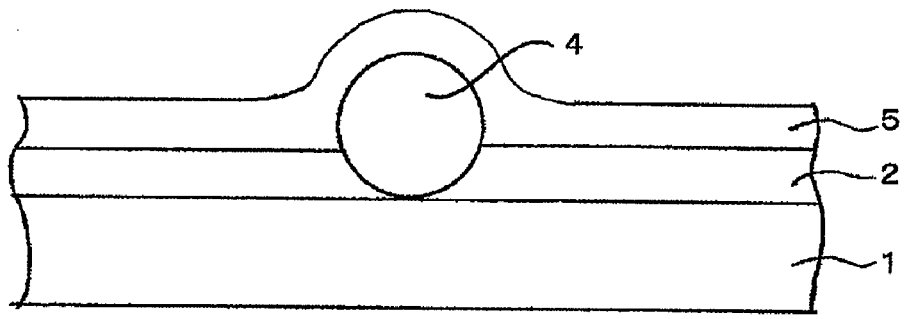

FIG. 4 (B) is a view illustrating the state that a metal wire 4 is mounted on the substrate 1, and is similar to what explained in the above-mentioned second embodiment.

Incidentally, a resin which coats the metal wire 4 is not provided.

FIG. 4 (C) is a view illustrating the state that the metal wire 4 is fixed on the substrate 1 by heating the metal wire 4 and thereby melting the resin layer 2 at a fixing step.

By heating the metal wire 4, the resin layer 2 which have been formed on the substrate 1 is allowed to melt.

Then, the metal wire 4 is allowed to be embedded in the resin layer 2 as a result of the progress that the metal wire 4 thrusts the melted resin layer 2 around the wire. Thus, the circumference of the metal wire can be covered smoothly by the resin layer 2 thrust aside, and which fact can contribute to the fixing of the metal wire 4 onto the substrate 1.

As mentioned above, in this embodiment, the metal wire 4, per se, is mounted on the substrate 4, and the metal wire 4 is fixed on the substrate 1 by melting the resin layer 2 which has been previously provided on the substrate.

Therefore, as the material which composes the resin layer 2 which is formed onto the substrate, it is desirable to use the same materials as shown in the above-mentioned third embodiment.

FIG. 4 (D) is a view illustrating the state that the electrode 5 is formed filmily so as to cover the substrate 1 and the metal wire 4 fixed on the substrate 1 with the electrode 5, and is similar to what explained in the above-mentioned first to third embodiments.

Incidentally, in this embodiment, it is possible to provide a cooling step for cooling the metal wire 4 after the fixing step shown in FIG. 4(C) and before the film forming step shown in FIG. 4 (D) in an analogue fashion with the first to third embodiments mentioned above.

Manufacturing of a low resistance substrate R for the display device can be realized by above-mentioned embodiments according to the present invention.

Figure 5:
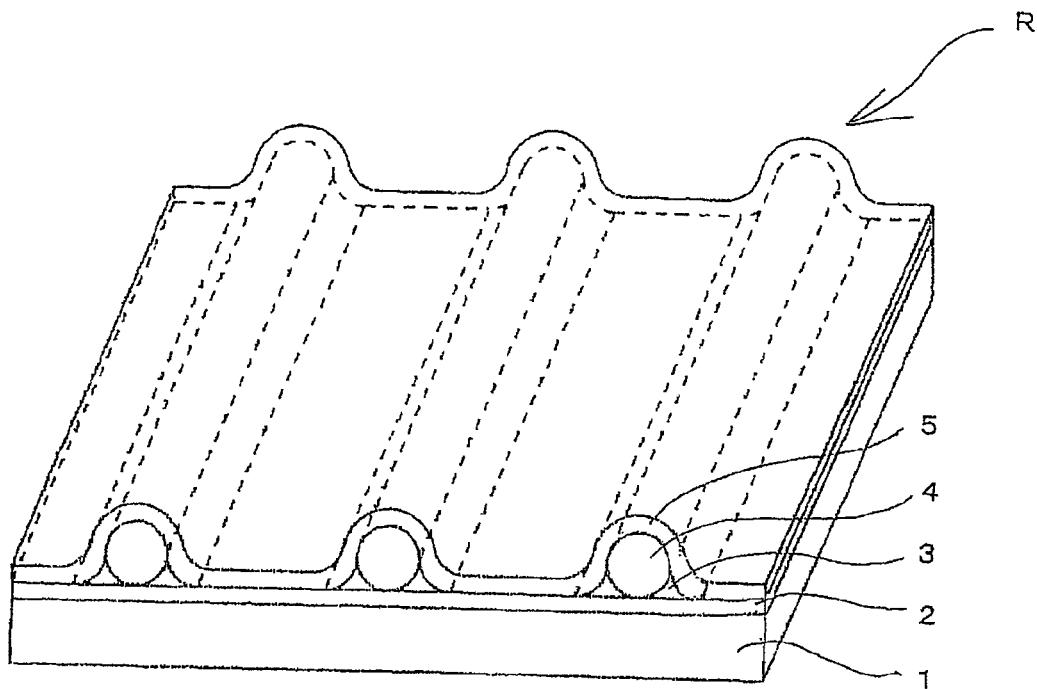
FIG. 5 is a schematic diagram illustrating a low resistance substrate for display device.

FIG. 5 is a schematic diagram illustrating the thus obtained low resistance substrate R for display device.

As shown in FIG. 5, the low resistance substrate R for display device comprises the substrate 1, the resin layer 2, the resin 3, the metal 4 and the electrode 5. According to this low resistance substrate R, even when the substrate R is used in a large display device, the metal 4 can assist the electrode 5 in its electrical conductivity. As a result, it becomes possible to repress the nonuniformity of brightness in the luminescence of the display device.

Incidentally, by utilizing a low resistance substrate which is prepared in accordance with the method for manufacturing low resistance substrate as described in the above-mentioned first to fourth embodiments, it is possible to provide an electroluminescence type optical display device, that enjoys the above-mentioned effect.

Although the present invention has been explained as above only in the case of manufacturing a low resistance substrate which is useful for the display device, the present invention is not limited to such a case, but the present invention may be applied in various cases such as a case of preparing a low resistance substrate suitable for solar cell, a case of preparing a low resistance substrate suitable for illumination, and so on.

Figure 6:
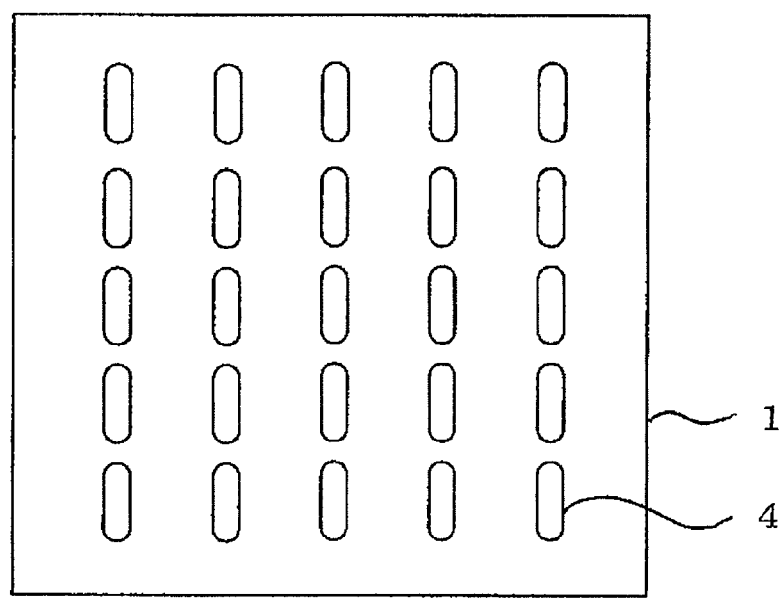
FIG. 6 is a schematic diagram illustrating another example of the metal.

In addition, although the described above is a case that the metal wires 5 as one example of the metal which is intended to be used as an auxiliary electrode are placed along the width direction of the substrate (See, FIG. 5), the present invention is not limited to such a case. For instance, when plural shorter metal members are aligned on lines individually along the width direction of the substrate, as shown in FIG. 6, it is also possible to make the metal members play a role as auxiliary electrode.

The material, the sectional configuration, the diameter, etc., of the metal members are similar to those in the case of the metal wire as described above.

The invention claimed is:

1. Method for manufacturing a low resistance substrate, comprising:
   a mounting step in which a linear article made of a resin-covered metal is mounted on a substrate;
   a fixing step in which the resin by which the metal is covered is melted by heating the linear article, the melted resin is allowed to come into and conform to space between the metal and the substrate, and thereby the metal is fixed on the substrate by the resin come in the space so that the resin gives a smooth curve at the space between the metal and the substrate as the outline of the space; and
   a film forming step in which an electrode is formed filmily so as to cover the substrate and the metal fixed on the substrate cover and contact with the electrode, wherein the electrode shows transparency or semitransparency.

2. The method for manufacturing low resistance substrate according to claim 1, further comprising an adhesiveness improvement layer forming step in which an adhesiveness improving layer made of an organic or inorganic material is formed onto the substrate in advance of the mounting step.

3. The method for manufacturing low resistance substrate according to claim 1, further comprising a surface reforming step for the surface of the substrate in advance of the mounting step.

4. The method for manufacturing low resistance substrate according to claim 1, further comprising a resin layer forming step in which a resin layer is formed on the substrate in advance of the mounting step.

5. The method for manufacturing low resistance substrate according to claim 4, wherein at the fixing step the resin layer is also melted by heating the linear article.

6. The method for manufacturing low resistance substrate according to claim 1, further comprising a cooling step for cooling the metal after the fixing step and before the film forming step.

7. The method for manufacturing low resistance substrate according to claim 1, wherein the linear article shows sectional configuration of circle.

* * * * *